United States Patent
Schwab et al.

(10) Patent No.: US 10,910,284 B2
(45) Date of Patent: Feb. 2, 2021

(54) SEMICONDUCTOR DEVICE AND METHOD OF MANUFACTURING THEREOF

(71) Applicant: Infineon Technologies Austria AG, Villach (AT)

(72) Inventors: Stefan Schwab, Vienna (AT); Herbert Hutter, Vienna (AT)

(73) Assignee: Infineon Technologies Austria AG, Villach (AT)

(*) Notice: Subject to any disclaimer, the term of this patent is extended or adjusted under 35 U.S.C. 154(b) by 198 days.

(21) Appl. No.: 15/371,554

(22) Filed: Dec. 7, 2016

(65) Prior Publication Data
US 2017/0162461 A1 Jun. 8, 2017

(30) Foreign Application Priority Data
Dec. 8, 2015 (DE) .................. 10 2015 121 344

(51) Int. Cl.
*H01L 23/26* (2006.01)
*H01L 23/31* (2006.01)
(Continued)

(52) U.S. Cl.
CPC .............. *H01L 23/26* (2013.01); *H01L 21/56* (2013.01); *H01L 23/295* (2013.01); *H01L 23/3121* (2013.01); *H01L 23/3135* (2013.01); *H01L 23/495* (2013.01); *H01L 23/564* (2013.01); *H01L 2224/37147* (2013.01);
(Continued)

(58) Field of Classification Search
CPC ....... H01L 23/26; H01L 21/56; H01L 23/295; H01L 23/3135; H01L 23/3121; H01L 23/495
See application file for complete search history.

(56) References Cited

U.S. PATENT DOCUMENTS 4,278,784 A * 7/1981 Wong ...................... C08L 83/14
257/791
4,735,702 A * 4/1988 Reinhoudt ........... G01N 27/414
204/416
(Continued)

FOREIGN PATENT DOCUMENTS

JP S5111377 A 1/1976
JP S5349952 A 5/1978
(Continued)

OTHER PUBLICATIONS

Machine Translation of JP 2002-359326 (Year: 2002).*

*Primary Examiner* — John E Uselding
(74) *Attorney, Agent, or Firm* — Murphy, Bilak & Homiller, PLLC (57) ABSTRACT

A semiconductor device includes a first semiconductor component having a semiconductor substrate, and a barrier layer disposed at least on or at a portion of the first semiconductor component. The barrier layer includes a polymer material and an organic metal complexing agent covalently bound to the polymer material. In an embodiment, the organic metal complexing agent includes a crown ether and/or cryptand. In an embodiment, the polymer material includes a homopolymer or copolymer resulting from the polymerization of monomers selected from the group consisting of: imides, epoxies, silicones, monomers having functional side chains, methacrylates, and any combinations thereof.

17 Claims, 2 Drawing Sheets

(51) Int. Cl.
*H01L 21/56* (2006.01)
*H01L 23/29* (2006.01)
*H01L 23/495* (2006.01)
*H01L 23/00* (2006.01)

(52) U.S. Cl.
CPC ............... *H01L 2224/40245* (2013.01); *H01L 2224/48091* (2013.01); *H01L 2224/48247* (2013.01); *H01L 2224/48472* (2013.01); *H01L 2224/83801* (2013.01); *H01L 2924/181* (2013.01)

(56) References Cited

U.S. PATENT DOCUMENTS

| | | |
|---|---|---|
| 5,049,201 A | 9/1991 | Cheng et al. |
| 5,287,000 A * | 2/1994 | Takahashi ........... H01L 23/4951 174/529 |
| 5,343,064 A * | 8/1994 | Spangler ............. B81C 1/00246 257/350 |
| 2003/0173612 A1* | 9/2003 | Krieger ................... H01L 45/04 257/304 |
| 2006/0087230 A1 | 4/2006 | Ghosh et al. |
| 2014/0117468 A1* | 5/2014 | Parris ................... G01N 27/221 257/414 |

FOREIGN PATENT DOCUMENTS

| | | | |
|---|---|---|---|
| JP | H0491169 A | | 3/1992 |
| JP | H10152600 A | | 6/1998 |
| JP | 2002093958 A | | 3/2002 |
| JP | 2002359326 A | | 12/2002 |
| JP | 2009176916 A | | 8/2009 |
| JP | 2011071216 A | * | 4/2011 |
| KR | 1020080006940 | * | 1/2008 ............. C09D 5/006 |

* cited by examiner

SEMICONDUCTOR DEVICE AND METHOD OF MANUFACTURING THEREOF

TECHNICAL FIELD

Embodiments described herein relate to a semiconductor device having a barrier, an encapsulation for a semiconductor device, and a method of manufacturing the semiconductor device. Embodiments of the present disclosure specifically relate to a semiconductor device having an ion getter layer and a method of manufacturing the ion getter layer.

BACKGROUND

A challenge in semiconductor devices is related to a migration of ions. With a tendency towards smaller device sizes, there is an increasing risk that migrating ions reach, for example, the gate oxide. This can lead to a shift of the threshold voltage of the semiconductor device. The shift in the threshold voltage could even result in a failure of the semiconductor device. Among the migrating ions, specifically sodium ions are known to move rather quickly through the semiconductor device. Specifically, sodium is a frequently occurring element and has a rather small ion radius. Accordingly, binding of sodium ions to prevent the sodium ions from reaching, for example, the gate oxide can be challenging. Another adverse effect caused by migrating ions is corrosion, for example, and reducing or preventing the migration of ions exhibiting corrosive action, such as for example fluoride or chloride, generally is desired.

In view of the above, there is a need for new semiconductor devices, encapsulations for semiconductor devices, and methods of manufacturing the semiconductor device that provide improved barrier or ion getter properties. Specifically, there is a need for new semiconductor devices, encapsulations for semiconductor devices, and methods of manufacturing the semiconductor device that are capable of reducing or even preventing a migration of ions, such as sodium ions.

SUMMARY

According to an aspect of the present disclosure, a semiconductor device is provided. The semiconductor device includes a first semiconductor component including a semiconductor substrate, and a barrier layer provided at least on or at a portion of the first semiconductor component. The barrier layer comprises a polymer material and an organic metal complexing agent covalently bound to the polymer material.

According to another aspect of the present disclosure, a semiconductor device is provided. The semiconductor device includes a first semiconductor component and a barrier layer provided at least on or at a portion of the first semiconductor component. The barrier layer comprises a polymer material and at least one cryptand embedded in the polymer material.

According to yet another aspect of the present disclosure, a semiconductor device is provided. The semiconductor device includes a first semiconductor component and a barrier layer provided at least on or at a portion of the first semiconductor component. The barrier layer comprises a polymer material formed by covalently cross-linked organic metal complexing agent. The metal complexing agent comprises at least a crown ether and/or cryptand (at least one of crown ether and cryptand).

According to another aspect of the present disclosure, an encapsulation for a semiconductor device is provided. The encapsulation includes a polymer material and an organic metal complexing agent covalently bound to the polymer material.

According to an aspect of the present disclosure, a method of manufacturing a semiconductor device having at least one semiconductor component is provided. The method includes preparing a barrier material by covalently binding an organic metal complexing agent to a polymer material, and applying the barrier material to at least a portion of the at least one semiconductor component to form a barrier layer.

According to another aspect of the present disclosure, a method of manufacturing a semiconductor device having at least one semiconductor component is provided. The method includes preparing a barrier material by embedding at least one cryptand in a polymer material, and applying the barrier material to at least a portion of the at least one semiconductor component to form a barrier layer.

According to yet another aspect of the present disclosure, a method of manufacturing a semiconductor device having at least one semiconductor component is provided. The method includes preparing a barrier material consisting of at least a crown ether and/or cryptand, and applying the barrier material to at least a portion of the at least one semiconductor component to form a barrier layer.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

In the following detailed description, reference is made to the accompanying drawings, which form a part hereof, and in which are shown by way of illustration specific embodiments in which the invention may be practiced. In this regard, directional terminology, such as "top", "bottom", "front", "back", leading", "trailing", "lateral", and "vertical" etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

Figure 1A:
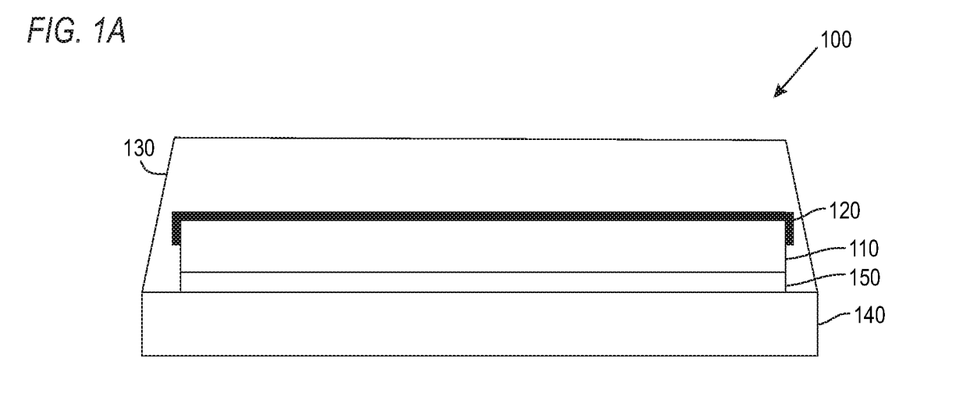
FIG. 1A shows a cross-sectional view of a semiconductor device according to embodiments described herein.

With reference to FIG. 1A, a semiconductor device 100 according to an embodiment is described. According to some embodiments, the semiconductor device 100 can be a power semiconductor device.

The semiconductor device 100 includes a semiconductor component 110 (also referred to as semiconductor chip), for example, having a semiconductor substrate (not shown). According to some embodiments, the semiconductor component 110 can be provided on a terminal 140. The terminal 140 is formed by a large land arranged below the semiconductor component 110 which is soldered with its lower side to the upper side of the terminal 140. The solder layer is indicated with reference numeral 150. Soldering can be done by any type of soldering. The underside of the terminal 140 is exposed to provide a large soldering and thermal contact. The lower side and the outer or lateral side of the terminal 140 are exposed while other sides such as the top side are completely encapsulated by an encapsulation 130. The encapsulation 130 can constitute a housing of the semiconductor device 100.

In some embodiments, a barrier layer 120 is provided at least on or at a portion of the at least one semiconductor component 110. The barrier layer 120 can include a polymer material. The barrier layer 120 covers at least a portion of a surface area of the at least one semiconductor component 110. In some implementations, the barrier layer 120 can partially or even fully cover a top side or top surface of the semiconductor component 110. As an example, the barrier layer 120 can cover at least 20%, specifically at least 50%, and more specifically at least 80% of the top side or top surface. Optionally, the barrier layer 120 can partially or fully cover at least one of the side surfaces of the semiconductor component 110. According to some embodiments, the barrier layer 120 can be disposed directly on the semiconductor component 110, i.e., the barrier layer 120 is in direct contact with the semiconductor component 110. In other embodiments, one or more further layers can be provided between the barrier layer 120 and the semiconductor component 110, i.e., the barrier layer 120 is not in direct contact with the semiconductor component 110.

According to some embodiments, the encapsulation 130 encloses or surrounds the at least one semiconductor component 110 and the barrier layer 120. Specifically, the barrier layer 120 is at least partially provided between the at least one semiconductor component 110 and the encapsulation 130. According to some embodiments, which can be combined with other embodiments described herein, the encapsulation 130 can be made of a moulding material different from the polymer material of the barrier layer 120.

In some embodiments, a method of manufacturing the semiconductor device 100 can include providing a moulding material different from the polymer material of the barrier layer 120, and encapsulating the at least one semiconductor component 110 and the barrier layer 120 to form an encapsulating moulding (the encapsulation 130) comprised of the moulding material.

In an embodiment, the material of the barrier layer 120 can be applied as a liquid by a suitable coating technique such as spin coating or inkjet printing. The liquid can contain unreacted monomers and/or polymers that are cured in a further process. If a selective curing is desired, the applied liquid is illuminated with radiation such as UV light using a mask that allows selective exposure of portions of the applied liquid that shall be cured. The liquid is then developed and the unexposed portions of the liquid are removed.

In a further process, a thermal process is applied for removing volatile components and to at least partially cure the remaining portions of the liquid to form a cured barrier layer 120. The curing can include more than on thermal process and can be carried out in cycles.

A final plasma treatment in an e.g. helium/oxygen or nitrogen/oxygen atmosphere can be used to clean the surface of the polymeric layer to reduce contaminations and/or to increase adhesion of the following layer.

A method for manufacturing a barrier layer 120 can thus include applying a liquid containing unreacted monomers and/or polymers, optionally exposing the applied liquid to radiation, if needed selective exposing using a lithographical mask, optionally developing of the exposed and/or unexposed liquid, a thermal treatment for curing, and an optional treatment in a plasma.

The barrier layer 120 of the present disclosure is configured to immobilize ions which diffuse into the barrier layer 120, for example, coming from the encapsulation 130. Migrating ions generally include cations and anions. Cations include alkali cations such as for example lithium, sodium or potassium ions, earth alkaline cations such as for example calcium or magnesium ions, and ions of elements belonging to other groups of the periodic table, in particular ions of transition metals. Anions include in particular the halogens such as for example fluoride and chloride. In the following, reference will be made to sodium ions as a particular example, but the invention is not restricted thereto and is applicable to other ions the migration of which is intended to be reduced. Specifically, the barrier layer 120 is configured to immobilize sodium ions. Accordingly, the barrier layer 120 according to the embodiments described herein can be configured as an ion getter layer. The barrier layer 120 prevents ions from reaching, for example, the gate oxide of the semiconductor component 110. A shift of the threshold voltage of the semiconductor component 110 can be reduced or even avoided. A functionality of the semiconductor device can be ensured.

According to some embodiments, which can be combined with other embodiments described herein, the barrier layer 120 includes a polymer material and an organic metal complexing agent covalently bound to the polymer material. A covalent bond as used throughout the present disclosure is understood as a chemical bond that involves the sharing of electron pairs between atoms of the polymer material and the organic metal complexing agent. Accordingly, the organic metal complexing agent is not merely dispersed or diluted in a polymer matrix, but is covalent bound to the molecules of the polymer. Fixing the organic metal complexing agent in the polymer by covalent bonds provides for several benefits, as compared to dispersing the organic metal complexing agent in a polymer matrix. When merely dispersing the organic metal complexing agent, the complexing agent may segregate and form discrete phases, in particular when used in higher concentrations. In addition, the organic metal complexing agent may precipitate, for example during a spin coating process. When covalently bound to the polymer, the organic metal complexing agent will be homogeneously distributed throughout the polymer, higher concentrations of the organic metal complexing agent may be achieved, and precipitation may be avoided. Moreover, metal complexing agents are potentially hazardous substances. The immobilization thereof by covalent fixation within a polymeric matrix prevents migration of the metal complexing agents, and accordingly avoids the formation of zones enriched with the metal complexing agents in potential hazardous concentrations at surfaces of the polymeric matrix.

According to an embodiment, the moulding material of the encapsulating moulding (the encapsulation 130) comprises a polyimide. The barrier layer 120 can be embedded in the moulding material. The moulding material can also be at least one of epoxy, PBO (cis-poly(p-phenylenebenzobisoxazole)), PBI (polybenzimidazole), polyimide, silicone, BCB (benzocyclobutene), PNB (polynorbornene), polysiloxane, and polyaromatic fluorocarbones.

According to an embodiment, the above mentioned polymers with our without the organic metal complexing agent may also be used as optional protective layer between the semiconductor substrate and the encapsulation moulding. Furthermore, the above mentioned polymers with our without the organic metal complexing agent may also be used as optional interlayer between different layers of the encapsulation moulding. For example the encapsulation moulding may include at least an inner layer and an outer layer and an interlayer between the inner layer and the outer layer. The inner layer and the outer layer of the encapsulating moulding 130 can be different either in the type of polymer used and/or whether one or both of the inner and outer layers contain the organic metal complexing agent. In addition to that, the interlayer can also include the organic metal complexing agent. The interlayer can be of a polymer different to the polymer of the inner and outer layer of the encapsulation moulding 130. The interlayer can form at least with one of the inner and outer layers of the encapsulating moulding 130 an interface.

Figure 1B:
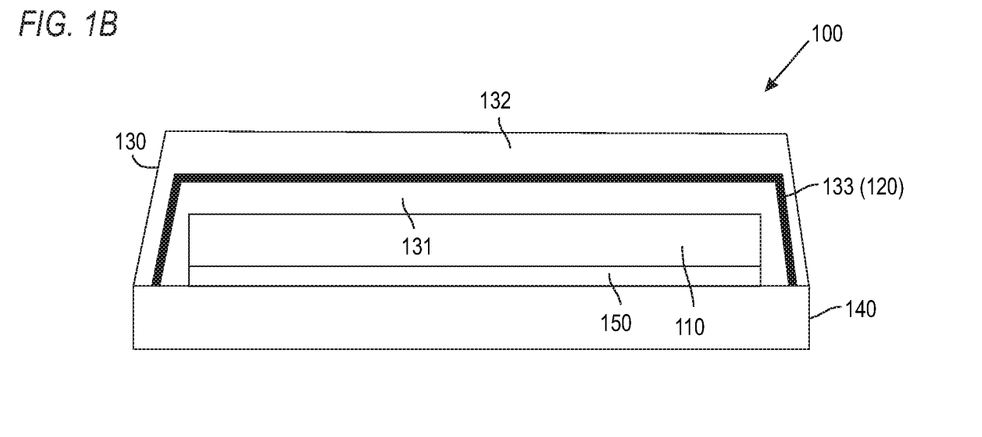
FIG. 1B shows a cross-sectional view of a semiconductor device according to embodiments described herein.

For example, FIG. 1B illustrates an embodiment of a semiconductor device 100 having an encapsulation 130 (encapsulating moulding) with an inner layer 131, an outer layer 133 and an interlayer 133 between the inner layer 131 and the outer layer 132. The interlayer 133 can be function as barrier layer 120 as described above. Alternatively, the inner layer 131 and/or the outer layer 132 can provide the barrier function and can include the organic metal complexing agent.

Figure 1C:
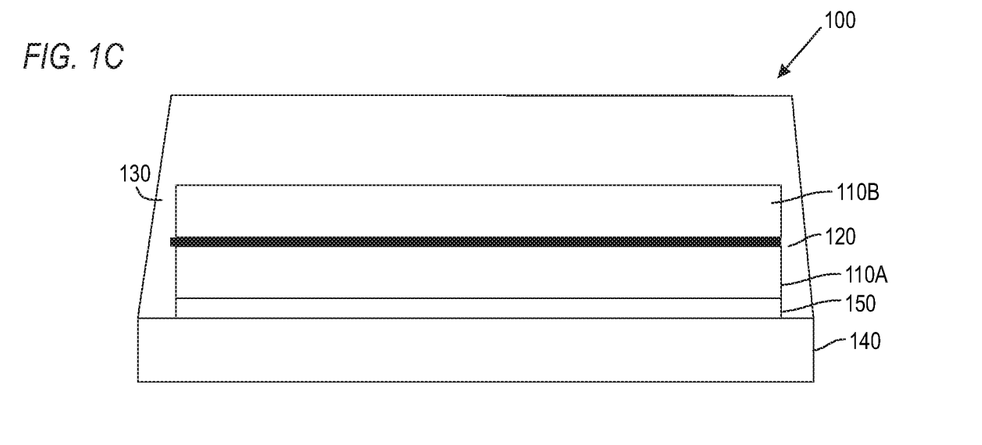
FIG. 1C shows a cross-sectional view of a semiconductor device according to embodiments described herein.

FIG. 1C illustrates an embodiment where the barrier layer 120 is formed between a first chip 110A forming a first semiconductor component and a second chip 110B forming a second semiconductor component in a semiconductor device 100. Both semiconductor components 110A and 110B are encapsulated in an encapsulation 130.

According to a further embodiment, the moulding material of the encapsulating moulding (the encapsulation 130) comprises a polymer material and an organic metal complexing agent embedded or covalently bound to the polymer material. According to an embodiment, the polymer material can be a polyimide and the organic metal complexing agent can be covalently coupled to the polyimide. Furthermore, any of the above mentioned polymer materials can be used as well.

The encapsulating moulding can be formed by a moulding material with embedded or covalently bound organic metal complexing agent or organic metal complexing agents such as cryptands or crown ethers without an additional polymeric barrier layer. The organic metal complexing agent or organic metal complexing agents are then embedded in or covalently bound to the polymer material of the encapsulating moulding. An additional barrier layer as described herein can be additionally provided which can be, for example, arranged between the semiconductor substrate and the encapsulating moulding, embedded in the moulding material of the encapsulating moulding, or on the encapsulating moulding. The encapsulating moulding can thus include the moulding material with or without the organic metal complexing agent and the optional barrier layer having the same or different organic metal complexing agent or organic metal complexing agents.

The organic metal complexing agent or organic metal complexing agents can be embedded or covalently bound to either of the moulding material and the barrier layer, or both.

The semiconductor device 100 can be manufactured by preparing a barrier material by covalently binding the complexing agent to the polymer material, and applying the barrier material to at least a portion of the at least one semiconductor component 110 to form the barrier layer 120. The metal complexing agent can be at least a crown ether and/or cryptand.

As an example, the barrier layer 120 includes the polymer material and cryptands embedded in the polymer material. The semiconductor device 100 can be manufactured by preparing a polymer material by embedding cryptands in the polymer material, and applying the barrier material to at least a portion of the at least one semiconductor component 110 to form the barrier layer 120.

According to some embodiments, which can be combined with other embodiments described herein, the barrier layer 120 includes a polymer material formed by a covalently cross-linked organic metal complexing agent, wherein the metal complexing agent can be at least a crown ether and/or cryptand. The semiconductor device 100 can be manufactured by preparing a material consisting of crown ethers and/or cryptands (and optionally spacers/linkers), and applying the polymer material to at least a portion of the at least one semiconductor component 110 to form the barrier layer 120.

In some embodiments, the semiconductor device can be manufactured as follows. Monomers may be pre-reacted with crown ethers and/or cryptands in order to form monomers having organic metal complexing functionality. Using such functionalized monomers allows for a higher concentration of the crown ethers and/or the cryptands, thus further improving the immobilization or ion getter properties of the barrier layer. Optionally, other monomers or copolymers can be added. Typically, the monomers having the crown ethers or cryptands covalently bound thereto can be polymerized to form the barrier material. In other examples, monomers can be first polymerized, and then the polymers formed can be reacted with crown ethers and/or cryptands.

According to some embodiments, the polymer can be pre-polymerized and a solution can be prepared, which can be applied to the semiconductor component using, for example, spin coating. Optionally, the method can include, after application of the solution, drying of the applied solution and curing the prepolymers by radiation polymerisation and/or thermal polymerisation.

In other embodiments, a solution for spin coating can be prepared using monomers, and the spin coating can be performed. Curing again may be done by radiation polymerisation and/or thermal polymerisation.

In other embodiments, curing may be done by radical polymerization. In such case, a solution for spin coating can be prepared and an initiator (like a two component adhesive) can be added to the solution immediately prior to the spin coating process. The spin coating process can be performed and the coated material can be cured by polymerization induced by the initiators. Optionally, radiation energy or thermal energy may be applied in order to support/accelerate polymerization.

In other embodiments, a polymer free of organic metal complexing agent may be used, and a cross-linking reagent having covalently bound organic metal complexing agent may be added to the polymer solution. The spin coating process can be performed and may coated material can be dried and crosslinked.

According to some embodiments, applying the barrier material may be done by a printing process, such as screen printing, stencil printing, or inkjet printing, instead of the spin coating process.

A concentration of the organic metal complexing agent covalently bound to the polymer material may vary over a broad range, such as for example 1 mol of the organic metal complexing agent per 200 g of the polymer material to 1 mol of the organic metal complexing agent per 1,500,000 g of the polymer material. In typical embodiments, a concentration of the organic metal complexing agent covalently bound to the polymer material is in a range of 1 mol organic metal complexing agent per 300 g polymer material to 1 mol organic metal complexing agent per 300,000 g polymer material. For example, a concentration of the organic metal complexing agent covalently bound to the polymer material is in a range of 1 mol organic metal complexing agent per 600 g polymer material to 1 mol organic metal complexing agent per 30,000 g polymer material. A higher concentration of the organic metal complexing agent provides for improved ion getter properties of the barrier layer 120.

Crown ethers are cyclic ethers that can complex ions, such as sodium ions. Oxygen atoms integrated in the crown ether structure are partially negatively charged, and their valence electrons can establish bindings with ions, such as sodium ions. Since the positive charge of the sodium ions is distributed over many oxygen atoms, stable complexes are formed, like a ring that is formed around the sodium ion.

Crown ethers generally are cyclic ethers typically having a general formula ($—CR^1R^2—CR^3R^4—O)_x—$ or having similar or related structures, wherein x typically is an integer of at least four (4) and up to eight (8). $R^1$ through $R^4$ are organic moieties, and most of $R^1$ through $R^4$ typically are hydrogen or a non-functional moiety, typically a lower aliphatic or aromatic moiety. At least one of $R^1$ through $R^4$ in at least one occurrence includes a functional group, however, which is able to form a covalent bond by reaction with a functional group of a monomer, polymer or cross-linking agent. According to some embodiments, which can be combined with other embodiments described herein, the crown ether incorporated into the barrier layer includes at least one of:

15-crown-5 and derivatives thereof,
18-crown-6 and derivatives thereof,
12-crown-4 and derivatives thereof,
21-crown-7 and derivatives thereof,
24-crown-8 and derivatives thereof, and any combination thereof.

Cryptands are compounds which, similar to crown ethers, form stable complexes with ions such as for example sodium ions. Analogously to crown ethers, cryptands are cyclic ethers, wherein two of the oxygen atoms are replaced by nitrogen atoms, however. The available free valences of the nitrogen atoms allow to link the nitrogen with an additional ether bridge. Accordingly, even more oxygen atoms are able to interact with the sodium ions, and even more stable complexes are formed, like a cup, that is imposed over the ions such as for example sodium ions.

Analogously as discussed above in the context of the crown ethers, as well the cryptants comprise at least one functional group which is able to form a covalent bond by reaction with a functional group of a monomer, polymer or crosslinking agent. According to some embodiments, which can be combined with other embodiments described herein, the cryptands include [2,2,2] Cryptand (=1,10-diaza-4,7,13,16,21,24-hexaoxabicyclo[8.8.8]hexacosane) and derivatives thereof. Another example of a cryptand suitable in the present invention is [2,2,1] Cryptand.

According to some embodiments, which can be combined with other embodiments described herein, the polymer material of the barrier layer 120 is a homopolymer or copolymer. The term "copolymer", as used herein is intended to encompass block copolymers and random copolymers, and to encompass any copolymers resulting from the polymerization of two, three, four or more different monomers. Suitable monomers are selected, for example, from the group consisting of: imides, epoxies, silicones, monomers having functional side chains, methacrylates, and any combinations thereof.

Polymers comprising organic metal complexing agents in the polymer backbone may be prepared by reacting at least one crown ether and/or cryptand having at least two functional groups with at least one monomer having at least two functional groups capable of reacting with the functional groups of the organic metal complexing agent. As a specific example, a di-amino derivatized crown ether might be reacted with a di-acid or di-anhydride derivatized monomer in order to synthesize a polymer comprising organic metal complexing agents in the backbone. As another example, di-halogen derivatized crown ether might be reacted with silanes in order to synthesize such polymer.

The polymer material of the barrier layer 120 includes materials which are solid or semi-solid at operating temperatures. Operating temperatures depend inter alia on the type of the particular polymer material. With respect to polyimides, for example, operating temperatures generally are within a range of −55° C. to 250° C., typically within a range of −55° C. to 175° C., such as 0° C. to 120° C. Semi-solid materials typically have a high viscosity at operating temperatures, and include materials such as waxes. Higher temperatures during application are also possible. During processing in the fab, higher temperatures are used (e.g. during curing).

The following exemplifies polyimide homopolymers and copolymers incorporating a derivative of 18-crown-6 in the polymer backbone. For example, a diamino-functional crown ether derivative such as 4,4'-diamino benzo-18-crown-6 (DAB18) may be reacted via polycondensation with one or more dianhydride-functional compounds such as hexafluoroisopropylidene diphenyl anhydride (6FDA) and oxydiphthalic anhydride (ODPA).

DAB18

6FDA

ODPA

Homopolymers resulting from the polymerization of DAB-18 with 6FDA and ODPA will consist of the repeating units DAB18-6FDA, or DAB-ODPA, respectively, shown below. Random or block copolymers resulting from the polymerization of DAB-18 with 6FDA and ODPA will comprise repeating units of both DAB18-6FDA and DAB-ODPA, in potentially varying amounts.

DAB18-6FDA

DAB18-ODPA

Further incorporation of the monomer bis(aminophenyl) fluorene (BAPF) will increase the hydrophobicity of the resulting polyimides, and increase the solubility in aprotic polar solvents, which is desirable for spin coating processes.

BAPF

Repeating units present in the copolymers DAB18-6FDA-BAPF and DAB18-ODPA-BAPF resulting from the polymerization of DAB-18 with either 6FDA or ODPA, in the presence of BAPF, are shown below. Copolymers resulting from the polymerization of DAB-18 with either 6FDA, ODPA and BAPF may be prepared as well.

DAB18-6FDA-BAPF

DAB18-ODPA-BAPF

Since the crown ether and/or the cryptands are covalently fixed in the polymer (for example, as polyimide chains or side chains), a previously captured sodium ion could only migrate any further by leaving the complex. Since the binding constants are very high, the migration of the sodium ion is considerably slowed or even prevented when using the polymer.

According to further embodiments described herein, the encapsulation may include a polymer material and an organic metal complexing agent covalently bound to the polymer material. As an example, the polymer material may be the polymer material described above with reference to the barrier layer. In such a case, the semiconductor device 100 may be free of a separate, distinct barrier layer. The encapsulation is configured to immobilize ions, such as sodium ions. Accordingly, the encapsulation may be configured as an ion getter element.

According to further embodiments, the encapsulation may include a copolymer which includes (a) a polyimide and the organic metal complexing agent covalently bound to the polymer material and (b) a polyimide without an organic metal complexing agent. Such a copolymer can be obtained, for example, by copolymerising monomers, such as imides, having an organic metal complexing agent covalently bound to the monomers and monomers, such as imides, which do not have an organic metal complexing agent. Hence, different monomers can be used. The monomers can be polymerized in the presence of anhydride, for example.

According to further embodiments, the encapsulation may include a copolymer which includes (a) a polymer and the organic metal complexing agent covalently bound to the polymer and (b) a polymer without an organic metal complexing agent. The polymers can be at least one of epoxy, PBO, PBI, polyimide, silicone, BCB, PNB, polysiloxane, SOG, and polyaromatic fluorocarbones. The polymers with and without an organic metal complexing agent can be the same or can be different.

The semiconductor component typically includes one discrete semiconductor device such as a power FET (field-effect transistor) or an IGBT (insulated gate bipolar device). Such devices include a plurality of substantially identical cells arranged in an active area of the semiconductor component. In case of power ICs, additionally there can be further devices like temperature and/or current sensors or further MOSFET devices. For electrical connection of such sensors, the semiconductor device can include at least a further terminal which can be referred to as sensor terminal.

The semiconductor devices as described herein are typically discrete power devices and do not include any driver logic or drive stage for driving the discrete device. Furthermore, each semiconductor device can include only one discrete semiconductor device unlike modules which include at least two power devices to form, for example, a half-bridge. The semiconductor device, however, can also include modules formed by discrete semiconductor devices, where for each of the discrete devices an additional terminal, which is in electrical connection with few, many or all field electrodes of the respective discrete device, is provided. It would also be possible to provide a common terminal for the field electrodes of the discrete devices or a common terminal for a subgroup of discrete devices.

The semiconductor component can be made of any semiconductor material suitable for manufacturing semiconductor devices. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GP), indium phosphide (InP), gallium nitride (GaN), aluminium gallium nitride (AlGaN), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, silicon ($Si_xC_{1-x}$) and SiGe heterojunction semiconductor material. For power semiconductor applications currently mainly Si, SiC and GaN materials are used.

Figure 2:
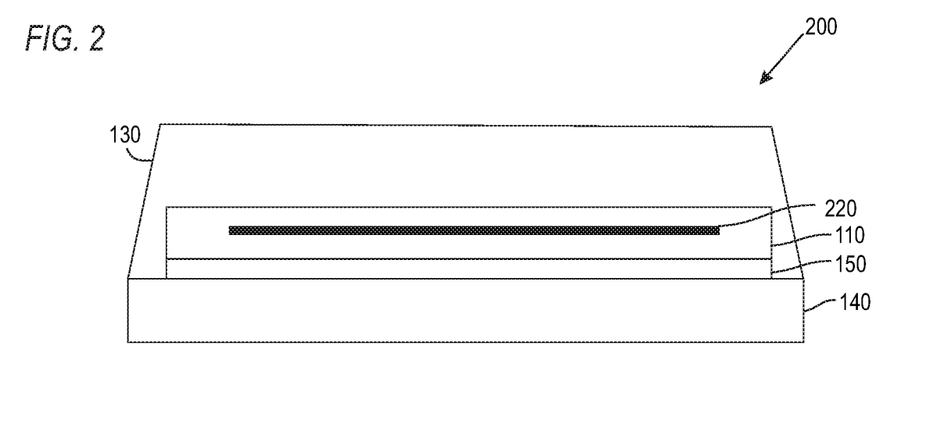
FIG. 2 shows a cross-sectional view of a semiconductor device according to further embodiments described herein.

FIG. 2 shows a cross-sectional view of a semiconductor device 200 according to further embodiments described herein. The semiconductor device 200 is similar to the semiconductor device 100 described above with reference to FIG. 1A, the difference lying in the positioning of the barrier layer 220.

Specifically, the barrier layer 220 is provided as an intermediate layer in the at least one semiconductor component 110. As an example, the barrier layer 220 can be provided as an intermediate dielectric layer.

Figure 3:
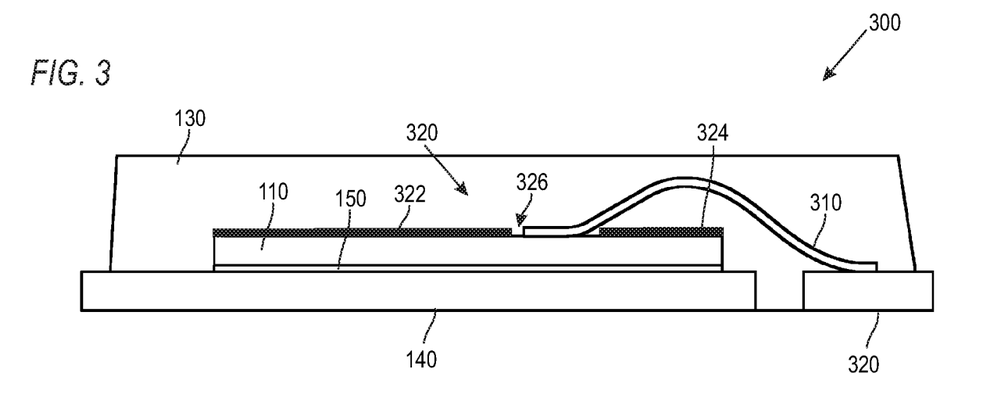
FIG. 3 shows a cross-sectional view of a semiconductor device having a lead frame according to embodiments described herein.

FIG. 3 shows a cross-sectional view of a semiconductor device 300 having an encapsulation according to embodiments described herein. The semiconductor device 300 includes a lead frame 310 at least partially embedded in the encapsulation 130, wherein the at least one semiconductor component 110 is electrically connected to the lead frame 310.

In FIG. 3, metal layers or pads formed on the upper side of the semiconductor component 110 are bonded by bond wires to the respective terminals or lands. FIG. 3 shows only a first terminal 320. The upper side of the first terminal 320 forms the landing pad for the bond wires 310. The lower side and the outer side of the first terminal 320 are exposed while the other sides including the landing pad side are completely encapsulated by the moulding material of the encapsulation 130. A second terminal 140 is formed by a large land arranged below the semiconductor component 110 which is soldered with its lower side to the upper side of the second terminal 140. The solder layer is indicated with reference numeral 150. Soldering can be done by any type of soldering. The underside of the second terminal 140 is exposed to provide a large soldering and thermal contact.

The semiconductor device 300 includes a barrier layer 320 having an opening or interruption 326. The opening or interruption 326 can be configured to provide a contact area for the bond wire 310 to contact the semiconductor component 110. Specifically, the opening or interruption 326 can expose a portion of the semiconductor component 110 to provide the contact area. In some implementations, the barrier layer 320 can have a first portion 322 provided on a first side of the contact area and a second portion 324 provided on a second side of the contact area opposite the first side.

As described above, the semiconductor device 300 can include a bond connection which electrically connects, for example, a source metallization of the semiconductor component 110 with the first terminal 320, wherein the bond wire 310 is embedded in the encapsulation 130. In an embodiment, which can be combined with any other embodiment described herein, a gate metallization can be electrically connected to a third terminal (not shown) by another bond wire forming a second bond connection, which is embedded in the encapsulation 130.

Figure 4:
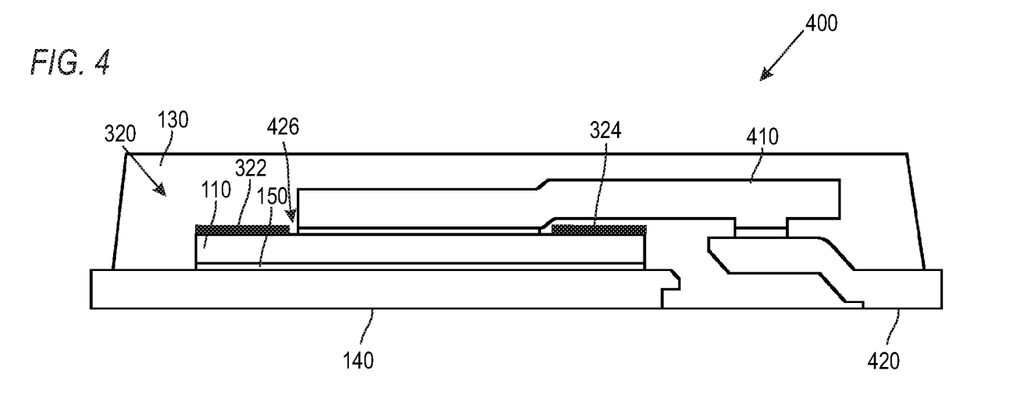
FIG. 4 shows a cross-sectional view of a semiconductor device having a lead frame according to further embodiments described herein.

FIG. 4 shows a cross-sectional view of a semiconductor device 400 having an encapsulation according to further embodiments described herein. The semiconductor device 400 includes a lead frame at least partially embedded in the encapsulation 130, wherein the at least one semiconductor component 110 is electrically connected to the lead frame. Specifically, the lead frame can be a clip 410.

The semiconductor component 110 is also soldered with a metal layer formed on the underside of the semiconductor component 110 to the second terminal 140. The soldering layer is indicated at 150. Different to FIG. 3, at least the source metallization of the semiconductor component 110 can be soldered to the clip 410 which can be a copper bond. The clip 410 is soldered to the first terminal 420. Alternatively, the first terminal 420 can include a die attachment pad, wherein the source metallization of the semiconductor component 110 is soldered to the die attachment pad. The embodiment of FIG. 4 exhibits a lower resistance due to the copper clip connection.

The semiconductor device 400 includes a barrier layer 320 similar to the barrier layer described with reference to FIG. 3. The opening or interruption 426 of the barrier layer 320 can be larger than the opening or interruption 326 shown in FIG. 3. Specifically, the contact area between the clip 410 and the semiconductor component 110 can be larger than the contact area between the bond wire 310 and the semiconductor component 110.

As described above, the organic metal complexing agent is provided to immobilize or getter ions such as alkali ions. The organic metal complexing agent can be covalently bound to the polymer material of the barrier layer or can form a polymer material of the barrier layer to provide the barrier layer with the ion gettering properties.

As further described above, the organic metal complexing agent is provided as complexing agent having the capability to complex migrating ions for immobilizing the ions.

Spatially relative terms such as "under", "below", "lower", "over", "upper", "above" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
a first semiconductor chip comprising a semiconductor substrate;
a barrier layer disposed at least on, in or at a portion of the first semiconductor chip; and
an encapsulation enclosing the first semiconductor chip and the barrier layer,
wherein the barrier layer comprises a polymer material and an organic metal complexing agent covalently bound to the polymer material,
wherein the metal complexing agent comprises a crown ether and/or cryptand.

2. The semiconductor device of claim 1, wherein the semiconductor device is a power semiconductor device.

3. A semiconductor device, comprising:
a first semiconductor chip;
a barrier layer disposed at least on or at a portion of the first semiconductor chip; and
an encapsulation enclosing the first semiconductor chip and the barrier layer,
wherein the barrier layer comprises a polymer material and at least one cryptand embedded in the polymer material.

4. A semiconductor device, comprising:
a first semiconductor chip;
a barrier layer disposed at least in, on or at a portion of the first semiconductor chip; and
an encapsulation enclosing the first semiconductor chip and the barrier layer,
wherein the barrier layer comprises a polymer material formed by a covalently cross-linked organic metal complexing agent,
wherein the metal complexing agent comprises at least a crown ether and/or cryptand.

5. A semiconductor device, comprising:
a first semiconductor chip comprising a semiconductor substrate;
a barrier layer disposed at least on, in or at a portion of the first semiconductor chip; and
an encapsulation enclosing the first semiconductor chip and the barrier layer,
wherein the barrier layer comprises a polymer material and an organic metal complexing agent covalently bound to the polymer material,
wherein the encapsulation comprises a moulding material different from the polymer material of the barrier layer.

6. A semiconductor device, comprising:
a first semiconductor chip comprising a semiconductor substrate;
a barrier layer disposed at least on, in or at a portion of the first semiconductor chip; and
an encapsulation enclosing the first semiconductor chip and the barrier layer,
wherein the barrier layer comprises a polymer material and an organic metal complexing agent covalently bound to the polymer material,
wherein the barrier layer is at least partially provided between the first semiconductor chip and the encapsulation.

7. A semiconductor device, comprising:
a first semiconductor chip comprising a semiconductor substrate;
a barrier layer disposed at least on, in or at a portion of the first semiconductor chip; and
an encapsulation enclosing the first semiconductor chip and the barrier layer,
wherein the barrier layer comprises a polymer material and an organic metal complexing agent covalently bound to the polymer material,
the semiconductor device further comprising a lead frame at least partially embedded in
the encapsulation, wherein the first semiconductor chip is electrically connected to the lead frame.

8. A semiconductor device, comprising:
a first semiconductor chip comprising a semiconductor substrate;
a barrier layer disposed at least on, in or at a portion of the first semiconductor chip; and
an encapsulation enclosing the first semiconductor chip and the barrier layer,
wherein the barrier layer comprises a polymer material and an organic metal complexing agent covalently bound to the polymer material,
wherein the barrier layer covers at least a portion of a surface area of the first semiconductor chip.

9. A semiconductor device, comprising:
a first semiconductor chip comprising a semiconductor substrate;
a barrier layer disposed at least on, in or at a portion of the first semiconductor chip; and
an encapsulation enclosing the first semiconductor chip and the barrier layer,
wherein the barrier layer comprises a polymer material and an organic metal complexing agent covalently bound to the polymer material,
wherein the barrier layer is an intermediate dielectric layer in the first semiconductor chip.

10. A semiconductor device, comprising:
a first semiconductor chip comprising a semiconductor substrate;
a barrier layer disposed at least on, in or at a portion of the first semiconductor chip; and
an encapsulation enclosing the first semiconductor chip and the barrier layer, wherein the barrier layer comprises a polymer material and an organic metal complexing agent covalently bound to the polymer material,
wherein a concentration of the organic metal complexing agent covalently bound to the polymer material is in a range of 1 mol of the organic metal complexing agent per 200 g of the polymer material to 1 mol of the organic metal complexing agent per 1,500,000 g of the polymer material.

11. A semiconductor device, comprising:
a first semiconductor chip comprising a semiconductor substrate;
a barrier layer disposed at least on, in or at a portion of the first semiconductor chip; and
an encapsulation enclosing the first semiconductor chip and the barrier layer,
wherein the barrier layer comprises a polymer material and an organic metal complexing agent covalently bound to the polymer material,
wherein the crown ether includes at least one of 15-crown-5 and derivatives thereof, 18-crown-6 and derivatives thereof, 12-crown-4 and derivatives thereof, 21-crown-7 and derivatives thereof, 24-crown-8 and derivatives thereof, or any combination thereof.

12. A semiconductor device, comprising:
a first semiconductor chip comprising a semiconductor substrate;
a barrier layer disposed at least on, in or at a portion of the first semiconductor chip; and
an encapsulation enclosing the first semiconductor chip and the barrier layer,
wherein the barrier layer comprises a polymer material and an organic metal complexing agent covalently bound to the polymer material,
wherein the cryptand includes [2,2,2] Cryptand (=1,10-diaza-4,7,13,16,21,24 hexaoxabicyclo[8.8.8]hexacosane), [2,2,1] Cryptand, and/or derivatives thereof.

13. A semiconductor device, comprising:
a first semiconductor chip comprising a semiconductor substrate;
a barrier layer disposed at least on, in or at a portion of the first semiconductor chip; and
an encapsulation enclosing the first semiconductor chip and the barrier layer,
wherein the barrier layer comprises a polymer material and an organic metal complexing agent covalently bound to the polymer material,
wherein the polymer material is a homopolymer or copolymer resulting from the polymerization of monomers selected from the group consisting one or more of: imides, epoxies, silicones, monomers having functional side chains and methacrylates.

14. A semiconductor device, comprising:
a first semiconductor chip comprising a semiconductor substrate;
a barrier layer disposed at least on, in or at a portion of the first semiconductor chip; and
an encapsulation enclosing the first semiconductor chip and the barrier layer,
wherein the barrier layer comprises a polymer material and an organic metal complexing agent covalently bound to the polymer material,
the semiconductor device further comprising a second semiconductor chip, wherein the barrier layer is disposed between the first semiconductor chip and the second semiconductor chip.

15. A semiconductor device, comprising:
a first semiconductor chip comprising a semiconductor substrate;
a barrier layer disposed at least on, in or at a portion of the first semiconductor chip; and
an encapsulation enclosing the first semiconductor chip and the barrier layer,
wherein the barrier layer comprises a polymer material and an organic metal complexing agent covalently bound to the polymer material,
wherein the barrier layer is disposed between an inner layer and an outer layer of the encapsulation.

16. A semiconductor device, comprising:
a first semiconductor chip comprising a semiconductor substrate;
a barrier layer disposed at least on, in or at a portion of the first semiconductor chip; and
an encapsulation enclosing the first semiconductor chip and the barrier layer,
wherein the barrier layer comprises a polymer material and an organic metal complexing agent covalently bound to the polymer material,
wherein the barrier layer is configured to immobilize ions which diffuse into the barrier layer.

17. A semiconductor device, comprising:
a first semiconductor chip comprising a semiconductor substrate;
a barrier layer disposed at least on, in or at a portion of the first semiconductor chip; and
an encapsulation enclosing the first semiconductor chip and the barrier layer,
wherein the barrier layer comprises a polymer material and an organic metal complexing agent covalently bound to the polymer material,
wherein the barrier layer is configured as an ion getter layer.

* * * * *

UNITED STATES PATENT AND TRADEMARK OFFICE
CERTIFICATE OF CORRECTION

PATENT NO. : 10,910,284 B2
APPLICATION NO. : 15/371554
DATED : February 2, 2021
INVENTOR(S) : S. Schwab et al.

It is certified that error appears in the above-identified patent and that said Letters Patent is hereby corrected as shown below:

In the Claims

Column 17, Line 51 (Claim 13, Line 13) please change "consisting one" to -- consisting of one --

Signed and Sealed this
Twenty-fifth Day of May, 2021

Drew Hirshfeld
*Performing the Functions and Duties of the*
*Under Secretary of Commerce for Intellectual Property and*
*Director of the United States Patent and Trademark Office*